(12) United States Patent
Aruga

(10) Patent No.: US 6,519,021 B1
(45) Date of Patent: Feb. 11, 2003

(54) WIRING BOARD FOR CONNECTION OF ELECTRO-OPTICAL PANEL, ELECTRO-OPTICAL DEVICE AND ELECTRONIC APPARATUS

(75) Inventor: Yasuhito Aruga, Okaya (JP)

(73) Assignee: Seiko Epson Corporation (JP)

( * ) Notice: Subject to any disclaimer, the term of this patent is extended or adjusted under 35 U.S.C. 154(b) by 0 days.

(21) Appl. No.: 09/483,832

(22) Filed: Jan. 17, 2000

(30) Foreign Application Priority Data

Jan. 18, 1999 (JP) .......................................... 11-009165
Dec. 2, 1999 (JP) .......................................... 11-343696

(51) Int. Cl.[7] .......................................... G02F 1/1336
(52) U.S. Cl. ........................................ 349/152; 349/151
(58) Field of Search ................................ 349/179, 150, 349/151, 152

(56) References Cited

U.S. PATENT DOCUMENTS 4,655,551 A * 4/1987 Washizuka et al. ......... 349/150
5,668,700 A   9/1997 Tagusa et al.
5,737,053 A * 4/1998 Yomogihara et al. ....... 349/149
5,740,482 A   4/1998 Inazuka
6,266,119 B1 * 7/2001 Takahashi et al. .......... 349/149

FOREIGN PATENT DOCUMENTS

WO    WO 95/13625    5/1995

* cited by examiner

Primary Examiner—James Dudek
(74) Attorney, Agent, or Firm—Harness, Dickey & Pierce, P.L.C.

(57) ABSTRACT

A wiring board (flexible wiring board) 400 for connection of an electro-optical panel is connected to an electro-optical panel (liquid crystal panel) 100 having a pair of opposed boards 200, 300. The wiring board (flexible wiring board) 400 for connection of the electro-optical panel comprises a first base material 412, wiring 414 having a predetermined pattern, and a second base material 416; a first terminal group 410 provided on the first base material 412; a second terminal group 420 provided on the second base material 416; and a third terminal group 430 provided on the first base material 412 or the second base material 416. The third terminal group 430 includes at least terminals electrically continuous to the first terminal group 410 and terminals electrically continuous to the second terminal group 420.

17 Claims, 11 Drawing Sheets

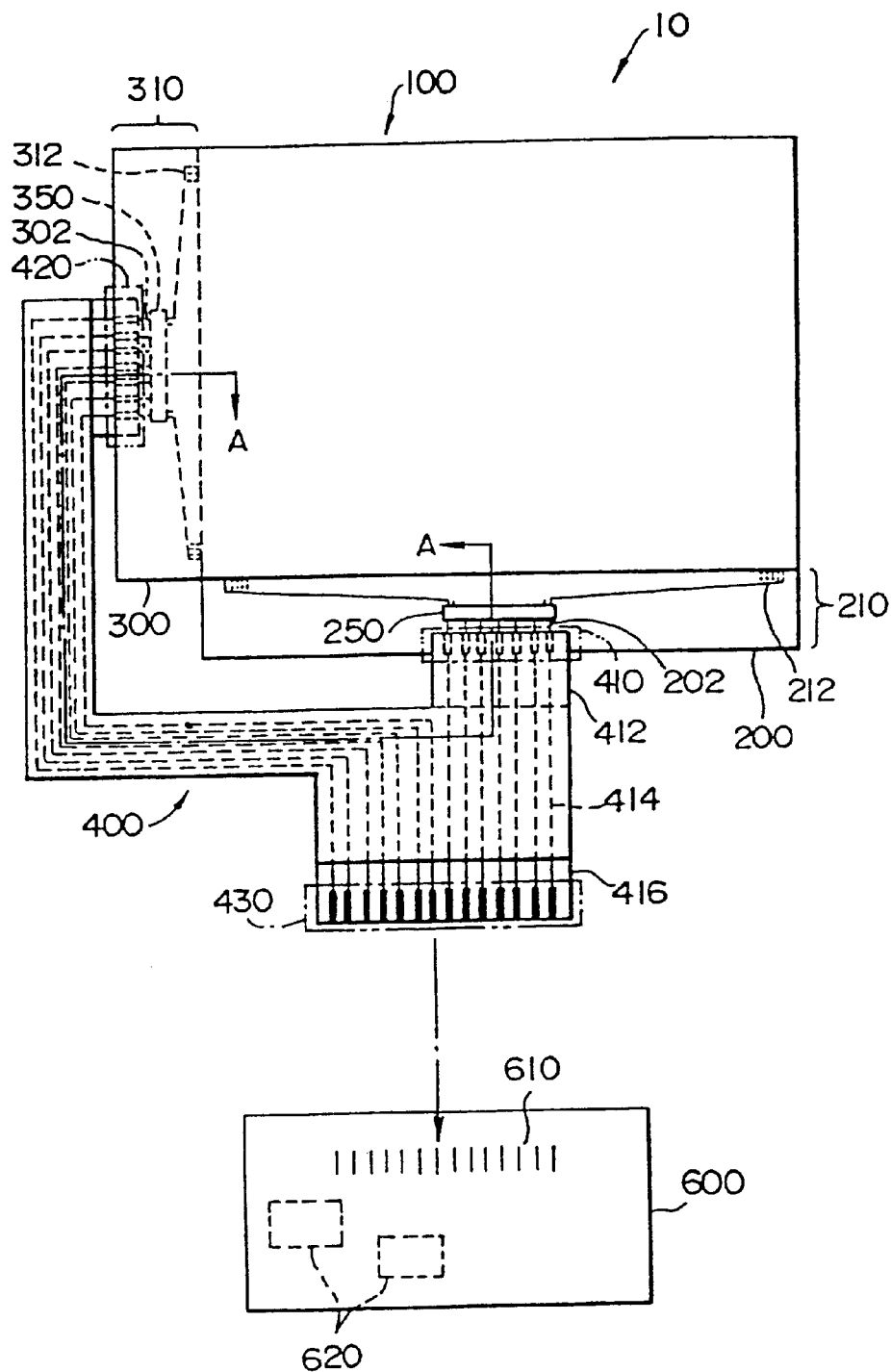
[FIG. 1]

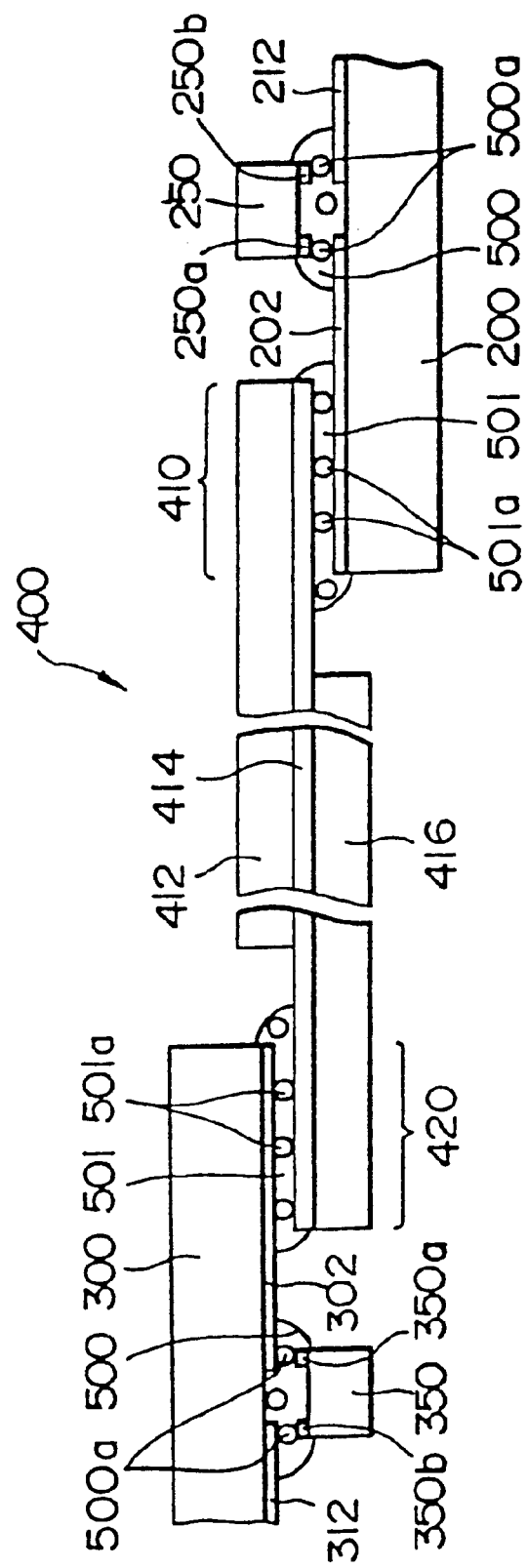
[FIG. 2]

[FIG. 3]
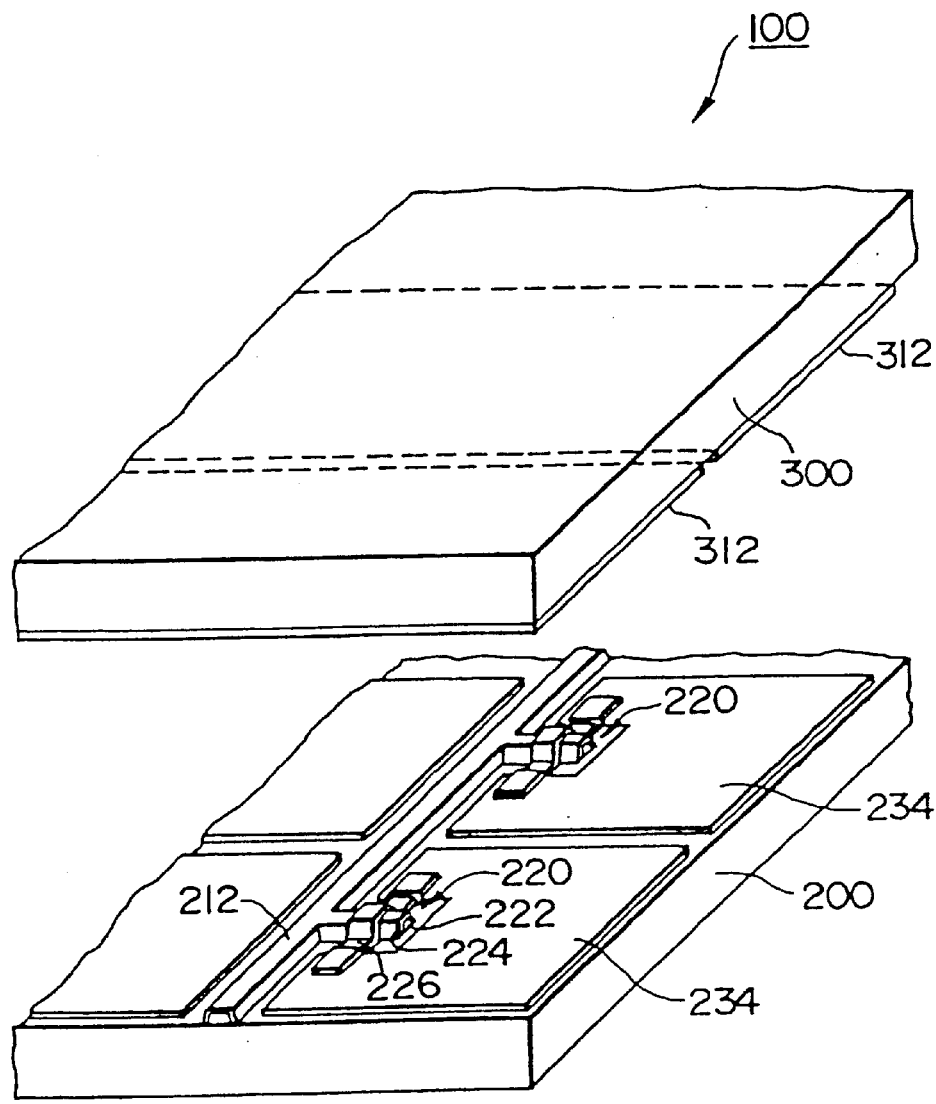
COLUMN DIRECTION
ROW DIRECTION

[FIG. 4]
(a)
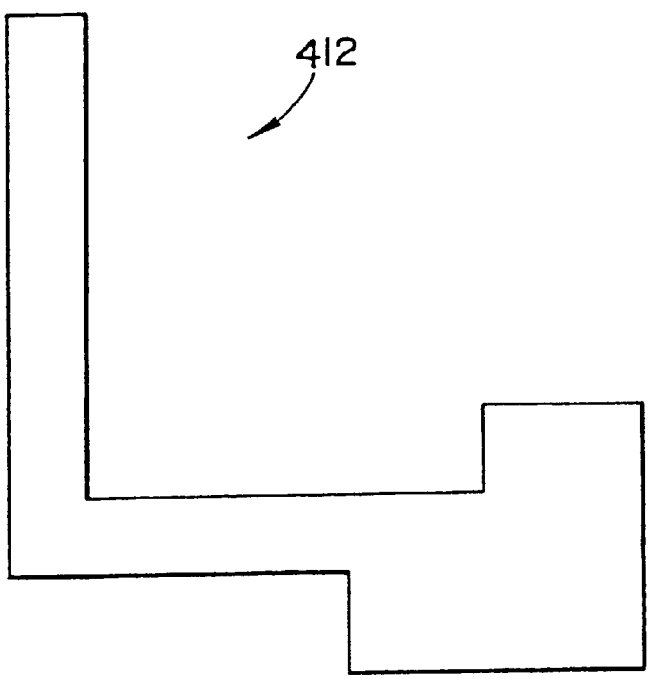
412
(b)
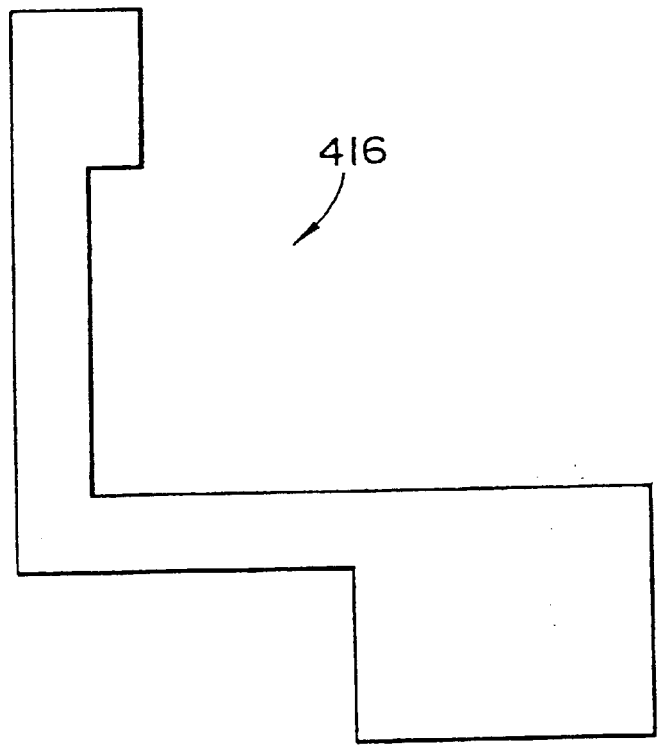
416

[FIG. 5]
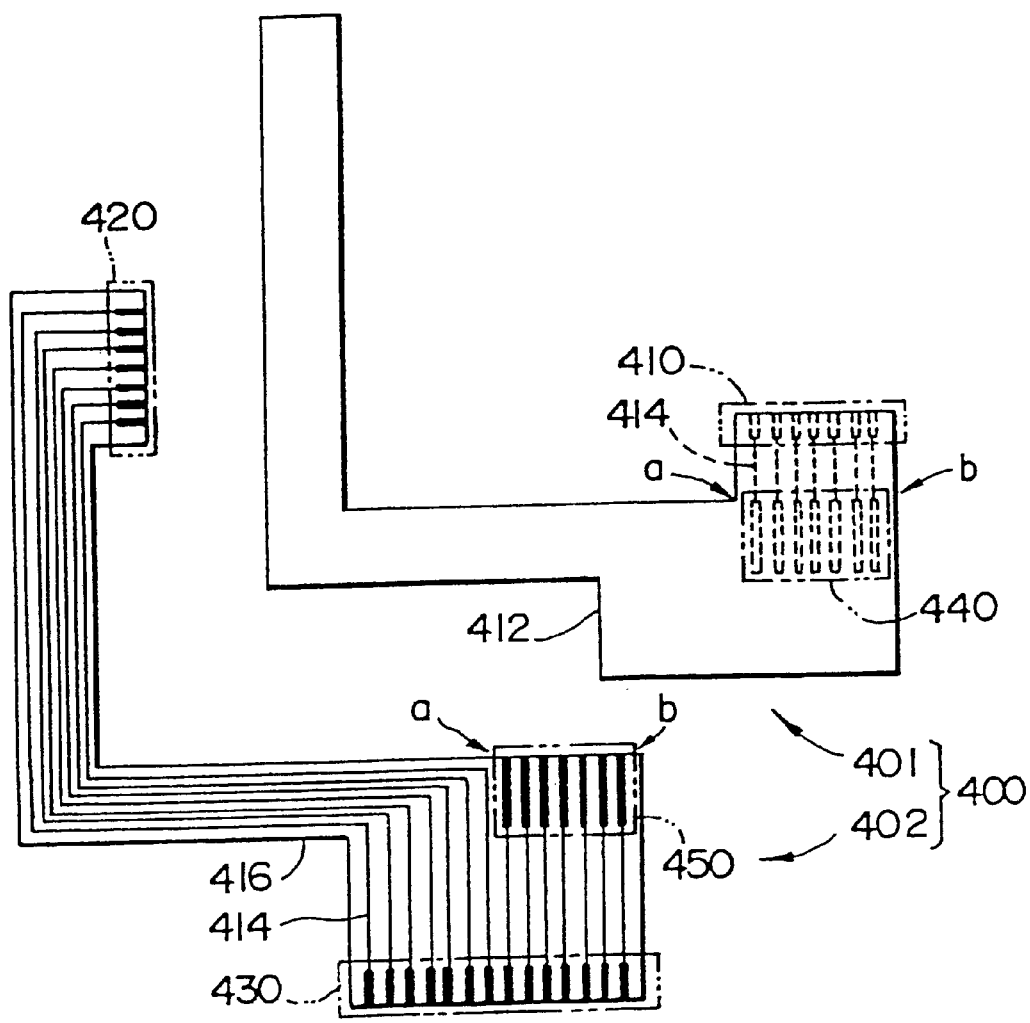

[FIG. 6]
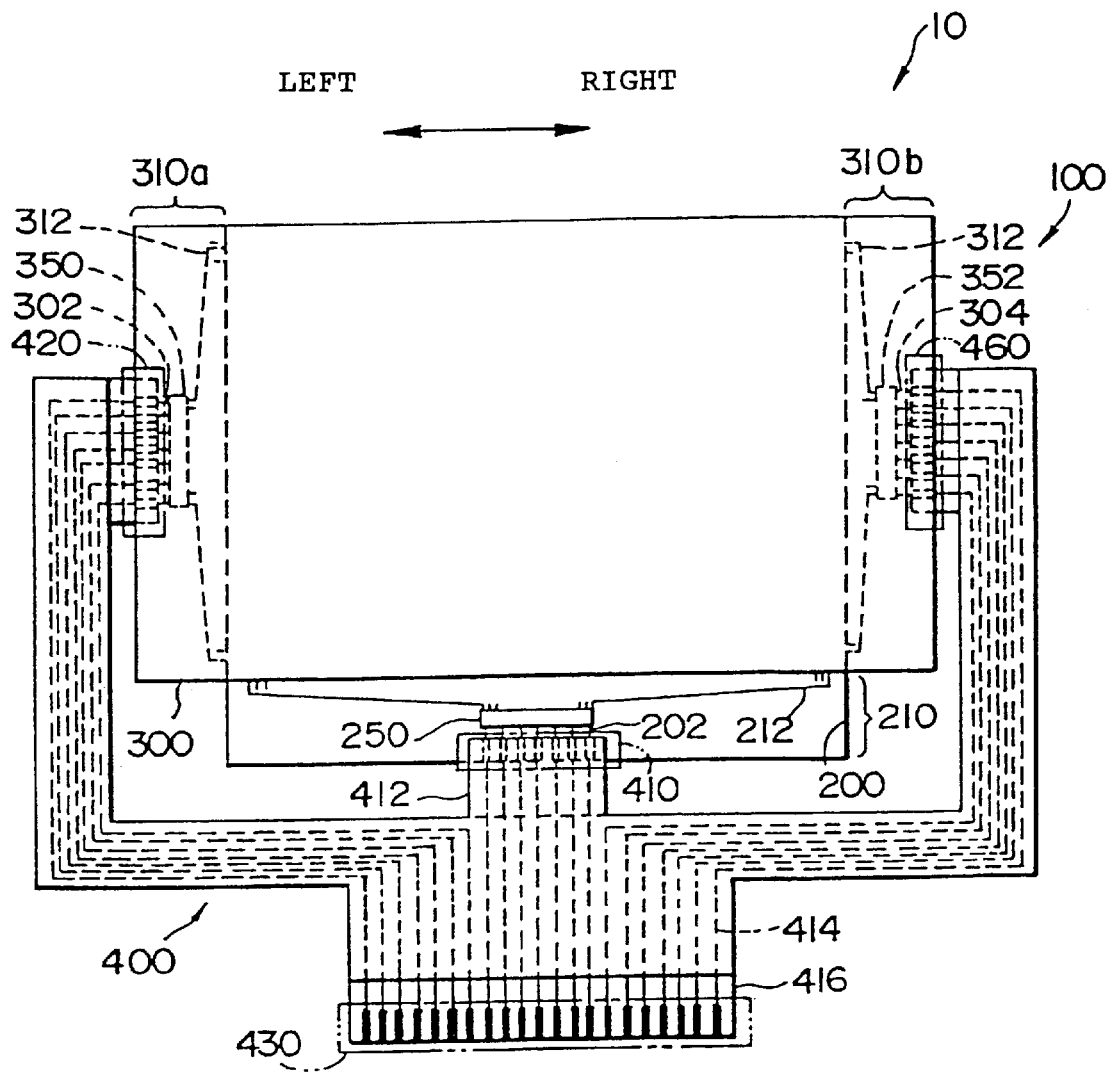

[FIG. 7]
(a)
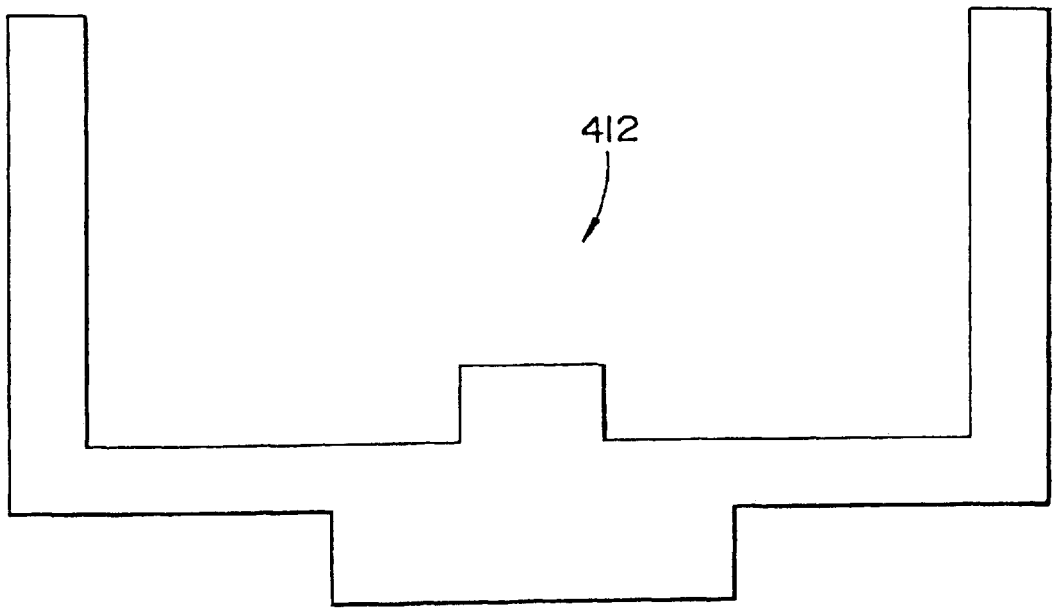
412
(b)
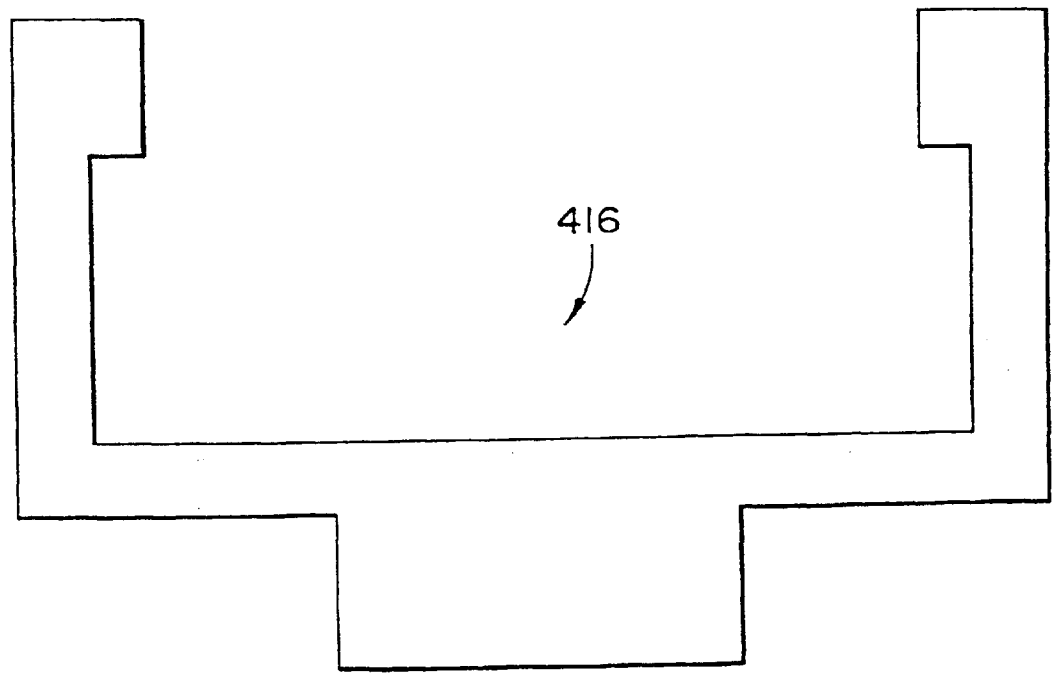
416

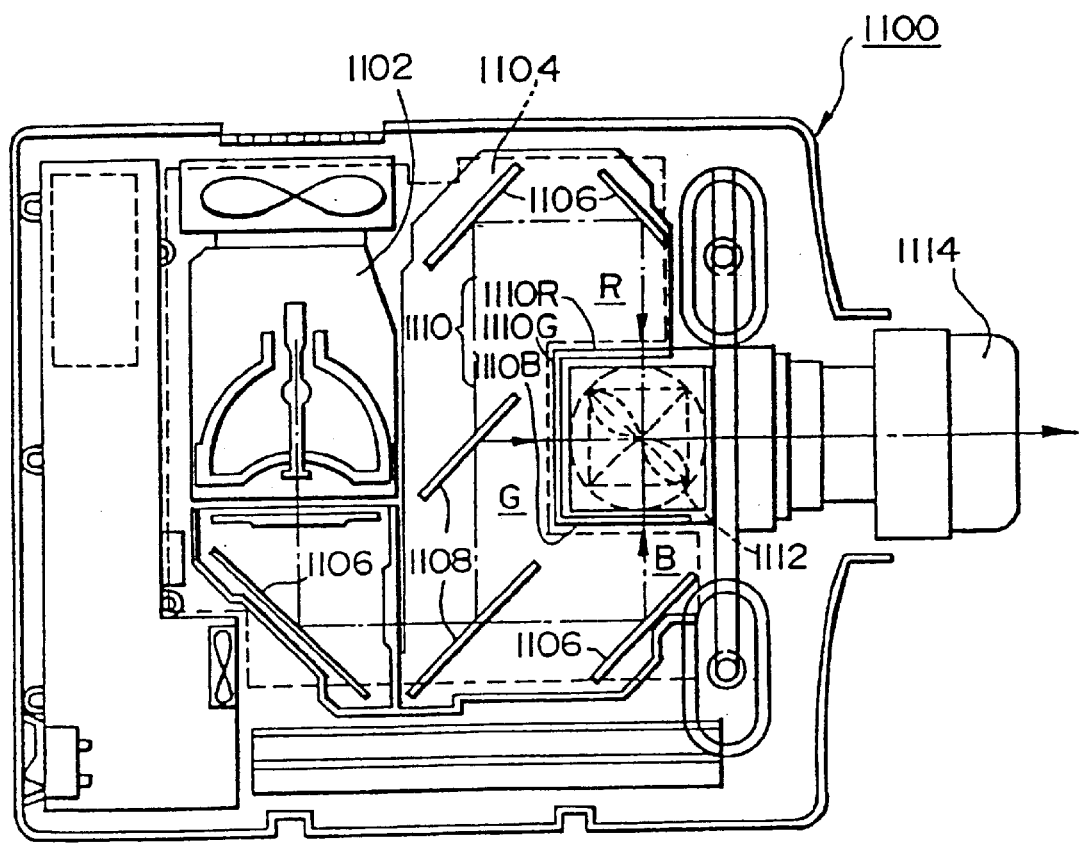
[FIG. 8]

[FIG.9]
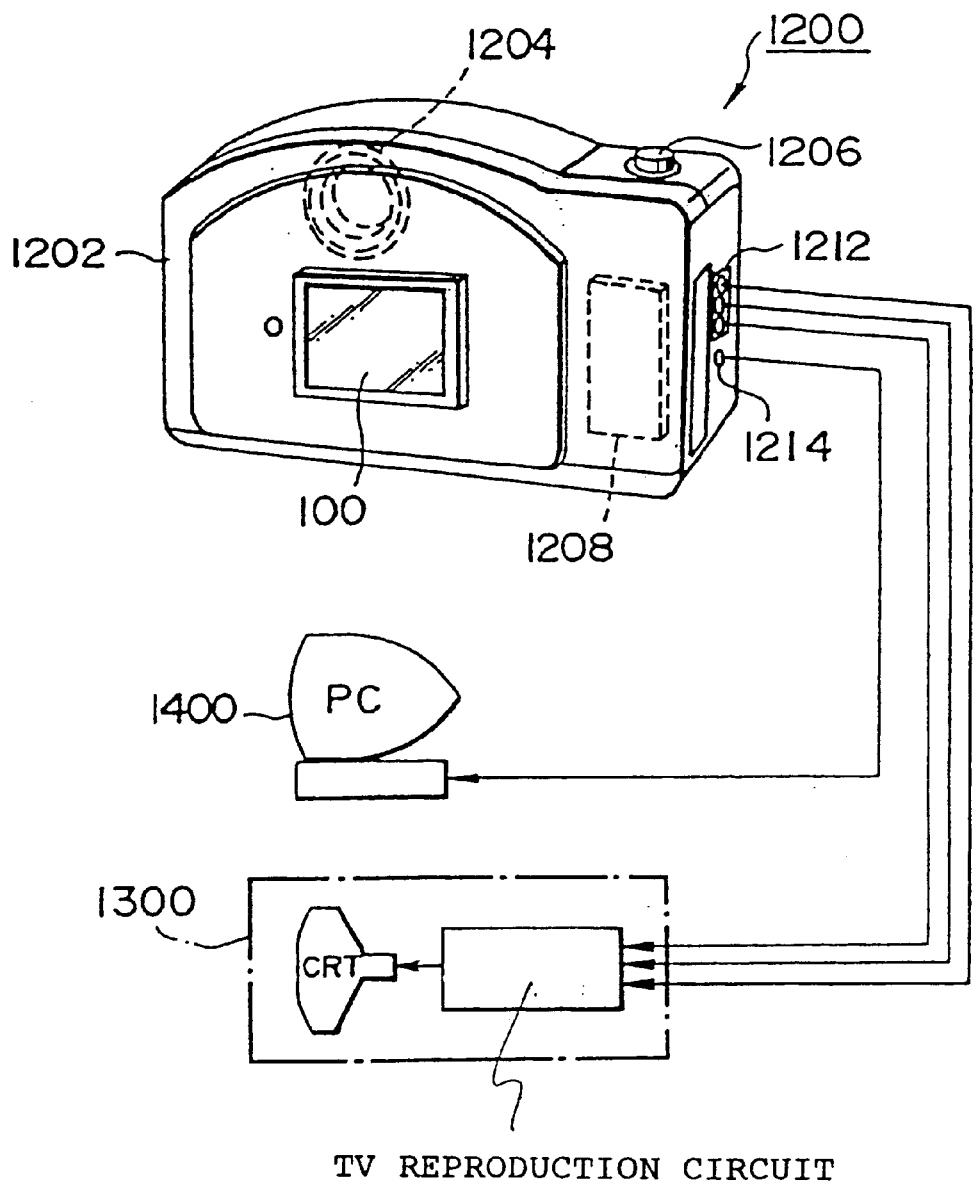
TV REPRODUCTION CIRCUIT

[FIG. 10]
(A)
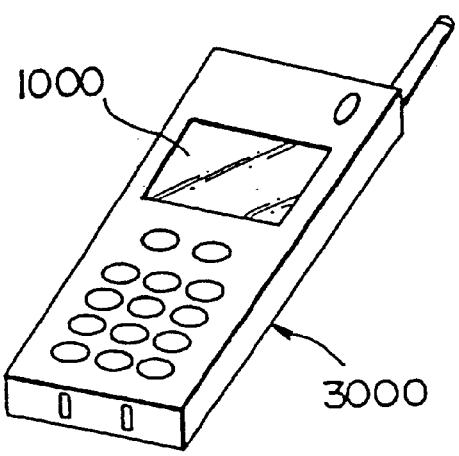
(B)
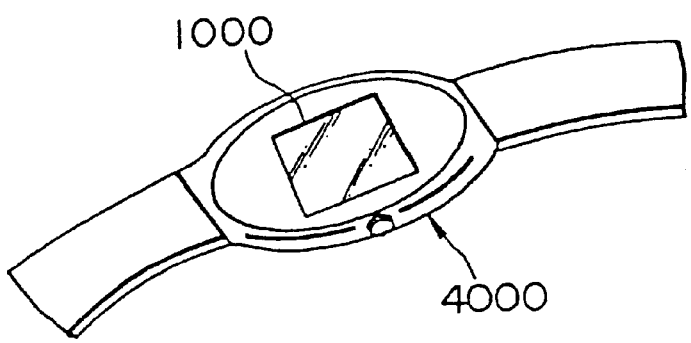
(C)
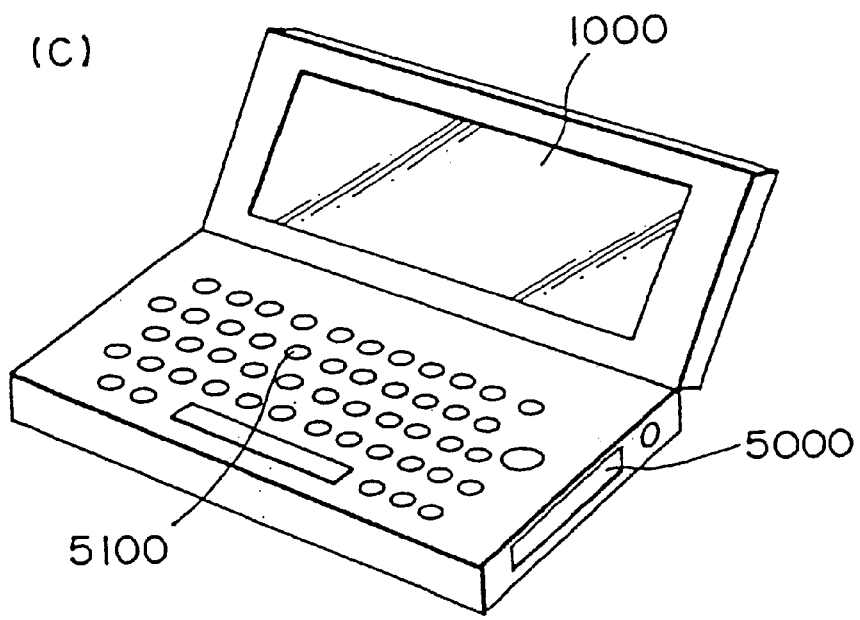

[FIG. 11]
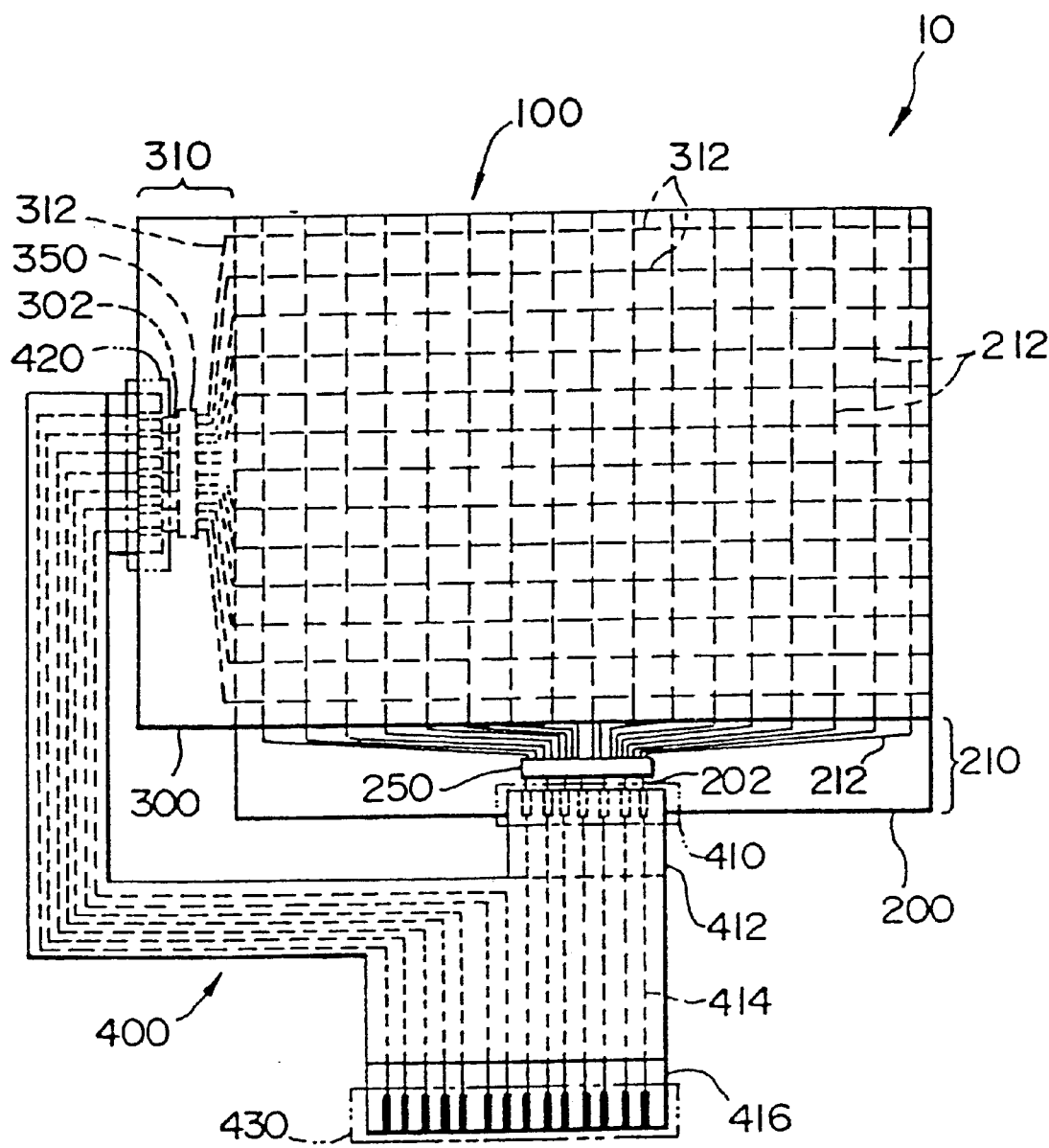

WIRING BOARD FOR CONNECTION OF ELECTRO-OPTICAL PANEL, ELECTRO-OPTICAL DEVICE AND ELECTRONIC APPARATUS

BACKGROUND OF THE INVENTION

1. Technical Field

The present invention relates to a wiring board for connection of an electro-optical panel, an electro-optical device employing the connection wiring board, and an electronic apparatus employing the electro-optical device.

2. Discussion

A liquid crystal panel is one example of conventional electro-optical panels. Liquid crystal panels are grouped into active-matrix type liquid crystal panels and passive-matrix type liquid crystal panels. An active-matrix type liquid crystal panel has switching devices provided in one-to-one relation to pixel electrodes. The switching devices are constituted by, for example, TFD (Thin Film Diode) devices. A passive-matrix type liquid crystal panel has no switching devices.

Such a liquid crystal panel comprises a pair of transparent substrates bonded to each other. The liquid crystal panel includes scanning lines formed on a surface of one of the transparent substrates facing the other, and data lines formed on a surface of the other transparent substrate facing the one. Namely, the scanning lines and the data lines are formed on the separate boards.

In a conventional liquid crystal panel, therefore, a first connection wiring board (e.g., an FPC (Flexible Printed Circuit) board) is connected to an upper transparent substrate from below. On the other hand, a second connection wiring board is connected to a lower transparent substrate from above. A group of terminals on each connection wiring board are inserted into a corresponding connector mounted on an external control circuit board.

For carrying out inspection, adjustment, various tests, etc. of a liquid crystal panel, it is often required to remove terminals of each connection wiring board from a connector of a control circuit board and conversely to insert the terminals of the connection wiring board into the connector of the control circuit board in a condition where both connection wiring boards are connected to the liquid crystal panel.

With the connection wiring boards having the above-described construction, however, the following problems occur.

(1) The control circuit board including connectors requires two connectors for two connection wiring boards. In other words, two connectors are required to connect the first connection wiring board to the control circuit board and connect the second connection wiring board to the control circuit board, respectively. This increases the number of parts.

(2) Groups of terminals on both connection wiring boards must be inserted and removed into and from the two connectors. Inspection, adjustment, various tests, etc. of a liquid crystal panel therefore become troublesome to carry out.

One object of the present invention is to provide a connection wiring board for connection of an electro-optical panel, which can be connected by one operation to, e.g., a member for driving the electro-optical panel.

Another object of the present invention is to provide an electro-optical device which employs the wiring board for connection of an electro-optical panel according to the present invention, and can be manufactured with ease.

Still another object of the present invention is to provide an electronic apparatus employing the electro-optical device according to the present invention.

SUMMARY OF THE INVENTION

The present invention resides in a wiring board for connection of an electro-optical panel, the connection wiring board being connected to an electro-optical panel having a pair of opposed substrates, the connection wiring board comprising:

- a first base material, wiring having a predetermined pattern, and a second base material;
- a first terminal group provided on the first base material;
- a second terminal group provided on the second base material; and
- a third terminal group provided on the first base material or the second base material;
- the third terminal group including at least terminals electrically continuous to the first terminal group and terminals electrically continuous to the second terminal group.

In the wiring board for connection of an electro-optical panel according to the present invention, the third terminal group includes at least terminals electrically continuous to the first terminal group and terminals electrically continuous to the second terminal group. With the present invention, therefore, the first terminal group and the second terminal group can be electrically connected to, for example, a member (e.g., a control circuit board) for driving the electro-optical panel by one operation.

The wiring board for connection of an electro-optical panel according to the present invention is preferably implemented in any of the following forms (a) to (j).

(a) The wiring board for connection of the electro-optical panel has a multilayered structure including the first base material, the wiring, and the second base material in at least a part of the connection wiring board. In the part where the multilayered structure is constructed, one of the two base materials can function as a protective layer for the wiring formed on the other base material.

(b) Preferably, a connection surface of the first terminal group and a connection surface of the second terminal group are oriented in opposed directions. With this feature, the first terminal group and the second terminal group can be easily connected to the opposed surfaces of both the boards of the electro-optical panel, respectively.

(c) Preferably, the first terminal group is exposed to the outside due to the absence of the second base material. The exposed first terminal group enables the electro-optical panel and the first terminal group to be connected more easily.

(d) Preferably, the second terminal group is exposed to the outside due to the absence of the first base material. The exposed second terminal group enables the electro-optical panel and the second terminal group to be connected more easily.

(e) Preferably, the first base material is formed of a flexible insulating film. With this feature, when the wiring board for connection of the electro-optical panel is connected to the electro-optical panel, the connection wiring board can be flexibly deformed. As a result, the wiring board for connection of the electro-optical panel can be more easily connected to the electro-optical panel.

(f) Preferably, the second base material is formed of a flexible insulating film. With this feature, when the wiring board for connection of the electro-optical panel is connected to the electro-optical panel, the connection wiring board can be flexibly deformed. As a result, the wiring board for connection of the electro-optical panel can be more easily connected to the electro-optical panel.

(g) The wiring can be formed of a material mainly containing any of copper, copper alloys (such as bronze, brass and beryllium copper), aluminum, aluminum alloys, gold, and silver.

(h) Further, the wiring board for connection of the electro-optical panel according to the present invention can be implemented in any of the following forms.

(4) The wiring in the first terminal group and the wiring in the second terminal group are positioned in the same layer. With this form, the first terminal group and the second terminal group can be formed in the same patterning step.

(2) The first base material further includes a fourth terminal group electrically continuous to the first terminal group; and the second base material further includes a fifth terminal group electrically continuous to the third terminal group, the fifth terminal group being electrically continued to the fourth terminal group.

In this form, the wiring board for connection of the electro-optical panel can be manufactured by connecting the first base material having the wiring formed thereon and the second base material having the wiring formed thereon such that the fourth terminal group and the fifth terminal group are electrically continuous to each other. As a result, the wiring board for connection of the electro-optical panel can be manufactured with ease.

(i) Moreover, the connection wiring board further comprises a sixth terminal group electrically continuous to the third terminal group. In this form, signals (e.g., scanning signals or data signals) can be input to the electro-optical panel with, for example, the first terminal group or the second terminal group and the sixth terminal group.

(j) Preferably, a shape of the first base material and a shape of the second base material are substantially the same except for the terminal groups. With this feature, one of the two base materials can function as a protective layer for the wiring formed on the other base material except for the terminal groups thereon.

The present invention also resides in an electro-optical device including an electro-optical panel having a first substrate and a second substrate opposed to each other, wherein:

the first substrate has a first connection terminal area not overlapping the second substrate;

the second substrate has a second connection terminal area not overlapping the first substrate;

the first connection terminal area and the second connection terminal area are electrically connected to the connection boards for wiring of the electro-optical panel according to the above described present invention;

a first terminal group on the connection wiring board is electrically connected to the first connection terminal area; and a second terminal group on the connection wiring board is electrically connected to the second connection terminal area.

The electro-optical device of the present invention includes the wiring board for connection of the electro-optical panel according to the present invention. Hence, the wiring board for connection of the electro-optical panel and a member (e.g., a control circuit board) for driving the electro-optical panel can be connected to each other with the third terminal group by one operation. As a result, the wiring board for connection of the electro-optical panel and the member for driving the electro-optical panel can be easily attached and detached. Also, the electro-optical device can be simply manufactured with a high yield.

The electro-optical device according to the present invention is preferably implemented in any of the following forms (a) to (d).

(a) At least one of connection between the first terminal group and the first connection terminal area and connection between the second terminal group and the second connection terminal area is established using an anisotropic conductive adhesive. With this feature, such a connecting step can be simplified.

(b) The electro-optical device is preferably employed as a liquid crystal device. When the electro-optical device is employed as a liquid crystal device, it is possible to more effectively develop the function of the electro-optical device.

(c) Data lines are provided in the first terminal group and scanning lines are provided in the second terminal group. In this form, data signals can be input to the first terminal group and scanning signals can be input to the second terminal group.

(d) A semiconductor device can be mounted in at least one of the first connection terminal area and the second connection terminal area. The semiconductor device may comprise, e.g., a driver IC.

An electronic apparatus of the present invention includes any of the above electro-optical devices according to the present invention. This feature improves, for example, convenience of the electronic apparatus based on the advantage of the electro-optical device according to the present invention. Also, the electronic apparatus can be simply manufactured with a high yield.

Hereinafter, the wiring board for connection of the electro-optical panel according to the present invention will be referred to as the "connection wiring board".

BRIEF DESCRIPTION OF THE DRAWINGS

FIG. 1 is a plan view showing an entire construction of a liquid crystal display device.

FIG. 2 is a schematic sectional view taken along line A—A in FIG. 1.

FIG. 3 is a schematic sectional view, partly broken away, showing a part of a liquid crystal panel.

FIG. 4A is a schematic plan view of a first base material shown in FIG. 1.

FIG. 4B is a schematic plan view of a second base material shown in FIG. 2.

FIG. 5 is a schematic exploded plan view of a flexible wiring board according to a second embodiment.

FIG. 6 is a schematic plan view of an electro-optical device according to the third embodiment.

FIG. 7A is a schematic plan view of a first base material shown in FIG. 6.

FIG. 7B is a schematic plan view of a second base material shown in FIG. 6.

FIG. 8 is a plan view showing an exemplified construction of a projector.

FIG. 9 is a perspective view showing a construction of a digital still camera.

FIG. 10A is an appearance view of a cellular phone,

FIG. 10B is an appearance view of a wrist watch, and

FIG. 10C is an appearance view of a personal digital assistant.

FIG. 11 is a plan view showing an entire construction of a liquid crystal display device of passive matrix driving type.

DETAILED DESCRIPTION OF THE PREFERRED EMBODIMENTS

Embodiments of the present invention will be described hereinafter with reference to the drawings.

An electro-optical device according to a first embodiment will be described at the outset. The electro-optical device according to the first embodiment represents an example in which the present invention is applied to a liquid crystal display of the active matrix driving type. FIG. 1 is a plan view showing an entire construction of the liquid crystal display device. FIG. 2 is a schematic sectional view taken along line A—A in FIG. 1.

A liquid crystal display device 10 comprises a liquid crystal panel (electro-optical panel) 100, a control circuit board 600, and a flexible wiring board (connection wiring board) 400.

The liquid crystal panel 100 will be described below.

A description is first made of a planar structure of the liquid crystal panel 100.

The liquid crystal panel 100 is an active-matrix type panel using TFD devices as switching devices for pixel electrodes. The liquid crystal panel 100 comprises a first board (device board) 200 and a second board (opposite board) 300. The first substrate 200 and the second substrate 300 are bonded to each other such that board surfaces having later-described electrodes formed thereon are positioned in opposed relation.

The first substrate 200 and the second substrate 300 have projected portions 210, 310 projecting from an overlapped area of both the substrates. A lower portion of the first substrate 200 (located on the rear side looking at FIG. 1 frontally) projects from the second substrate 300 (located on the front side looking at FIG. 1 frontally) to form the projected portion 210 not overlapping the second substrate 300. A left portion of the second substrate 300 projects from the first substrate 200 to form the projected portion 310 not overlapping the first substrate 200. In the projected portion 210 of the first substrate 200, a first connection terminal area 202 is formed on the front side of the first substrate 200 (namely, on the side facing the second substrate). In the projected portion 310 of the second substrate 300, a second connection terminal area 302 is formed on the rear side of the second substrate 300 (namely, on the side facing the first substrate).

In the first connection terminal area 202, a first bare chip (semiconductor device, e.g., driver IC, having a function to drive data lines) 250 is mounted in a predetermined position. The first bare chip 250 supplies data signals to data lines 212, respectively. The first bare chip 250 is mounted by employing, e.g., the COG (Chip On Glass) technique.

In the second connection terminal area 302, a second bare chip (semiconductor device, e.g., driver IC, having a function to drive scanning lines) 350 is mounted in a predetermined position. The second bare chip 350 supplies scanning signals to scanning lines 312, respectively. The second bare chip 350 is mounted by employing, e.g., the COG technique.

A description is now made of a sectional structure of the liquid crystal panel 100 with reference to FIG. 2.

The first bare chip 250 has input terminals 250a and output terminals 250b. The input terminals 250a are electrically connected to the first connection terminal area 202. The output terminals 250b are electrically connected to the respective data lines 212. The connection between the input terminals 250a and the first connection terminal area 202 and the connection between the output terminals 250b and the data lines 212 can be made using anisotropic conductive adhesives 500. Thus, conductive particles 500a dispersed in the anisotropic conductive adhesives 500 at an appropriate proportion establish electrical connection between the input terminals 250a and the first connection terminal area 202 and also establish the electrical connection between the output terminals 250b and the data lines 212.

The second bare chip 350 has input terminals 350a and output terminals 350b. The input terminals 350a are electrically connected to the second connection terminal area 302. The output terminals 350b are electrically connected to the respective scanning lines 312. The connection between the input terminals 350a and the second connection terminal area 302 can be made in a similar manner as the first bare chip 250. The connection between the output terminals 350b and the scanning lines 312 can also be made in a similar manner as the first bare chip 250.

A description is now made of an internal construction of the liquid crystal panel 100. FIG. 3 is a schematic sectional view, partly broken away, showing a part of the liquid crystal panel 100.

On one surface of the first substrate 200 facing the second substrate 300, there are formed a plurality of pixel electrodes 234 arrayed in a matrix pattern, and the data lines (signal lines) 212 extending in the column direction. The pixel electrodes 234 on one column are connected to one data line 212 in common through the respective TFD devices 220. Looking from the substrate side, the TFD device 220 comprises a first conductive film 222, an oxide film 224 formed by anodizing the first metallic film 222, and a second conductive film 226. Namely, the TFD device 220 has a sandwich structure of the first conductive film 222/the oxide film 224/the second conductive film 226. The TFD device 220 therefore has a diode switching characteristic in both the positive and negative directions.

On the other hand, the scanning lines 312 are arrayed on one surface of the second substrate 300 facing the first substrate 200. Concretely, the scanning lines 312 extend in the row direction perpendicularly to the data lines 212, and are arrayed to serve as opposite electrodes to the pixel electrodes 234. Though omitted in FIG. 3, color filters are disposed corresponding to areas in which the scanning lines 312 and the pixel electrodes 234 cross each other. Accordingly, a liquid crystal layer corresponding to one pixel is made up of the pixel electrode 234, the scanning line 312 serving as the opposite electrode, and a liquid crystal filled between both the substrates 200 and 300.

A certain gap (spacing) is held between the first substrate 200 and the second substrate 300 by virtue of both sealing materials (not shown) applied along peripheries of the substrates and spacers (not shown) distributed in appropriate positions. Stated otherwise, the first substrate 200, the second substrate 300, the sealing materials, and the spacers jointly define an enclosed space. A liquid crystal of TN (Twisted Nematic) or STN (Super Twisted Nematic) type, for example, is sealed in the enclosed space.

In the liquid crystal panel 100 thus constructed, the data lines 212 and the scanning lines 312 are electrically coupled to each other in mutually crossed portions. Concretely, the data lines 212 and the scanning lines 312 are in a condition where they are electrically coupled to each other via serial connection of the liquid crystal layer and the TFD device 220.

A description is now made of driving principles of the liquid crystal panel 100.

A voltage is applied to the TFD device 220 with a scanning signal applied to the scanning line 312 and a data signal applied to the data line 212. When a voltage exceeding the threshold value is applied to the TFD device 220, the TFD device 220 is turned on and a predetermined amount of electric charges is accumulated in the liquid crystal layer connected to the TFD device 220. Even with the TFD device 220 turned off after accumulation of electric charges, the electric charges accumulated in the liquid crystal layer are maintained if the resistance of the liquid crystal layer is sufficiently high. By thus driving the TFD device 220 to turn on/off and controlling the amount of the accumulated electric charges, orientation of the liquid crystal is changed for each pixel, whereby predetermined information can be displayed. In this connection, it is just required to accumulate electric charges in each liquid crystal layer for some part of a unit period. Therefore, the data lines 212 and the scanning lines 312 can be multiplex-driven by selecting the scanning lines in a time-shared manner. Here, the term "multiplex driving" means driving that is performed in common to a plurality of pixels.

A description is now made of the control circuit board 600.

As shown in FIG. 1, the control circuit board 600 includes a wiring circuit comprising various electronic parts 620 such as a power IC. The control circuit board 600 has a connecting portion 610 connected to a third terminal group 430 of the flexible wiring board 400.

A description is now made of the flexible wiring board (FPC board) 400 serving as the connection wiring board. In the first embodiment, the flexible wiring board 400 is employed as one example of the connection wiring board. FIG. 4A is a schematic plan view of a first base material 412 shown in FIG. 1. FIG. 4B is a schematic plan view of a second base material 416 shown in FIG. 1.

The flexible wiring board 400 comprises a first base material 412 (see FIG. 4A) and a second base material 416 (see FIG. 4B). The first base material 412 and the second base material 416 are bonded to each other with wiring 414 held therebetween (see FIG. 1). In other words, the flexible wiring board 400 has a multilayered structure (three-layered structure) of the first base material 412, the wiring 414, and the second base material 416. The wiring 414 is joined to at least one of the first base material 412 and the second base material 416.

The first and second base materials 412, 416 are each formed of, e.g., a flexible insulating film. Materials of the flexible insulating film include, e.g., polyimide, polyethylene terephthalate, epoxy resin, and polyester. Materials of the wiring 414 include, e.g., copper, copper alloys (such as bronze, brass and beryllium copper), aluminum, aluminum alloys, gold, and silver.

The flexible wiring board 400 has a first terminal group 410, a second terminal group 420, and the third terminal group 430. The first terminal group 410 is disposed on the first base material 412 and is constituted by the wiring 414 exposed to the outside due to the absence of the second base material 416. The second terminal group 420 is disposed on the second base material 416 and is constituted by the wiring 414 exposed to the outside due to the absence of the first base material 412. The third terminal group 430 is constituted by the wiring 414 exposed to the outside due to the absence of the first base material 412.

The first terminal group 410 is not covered by the second base material 416. The second terminal group 420 is not covered by the first base material 412. The surface (connection surface) of the first terminal group 410 and the surface (connection surface) of the second terminal group 420 are therefore oriented in opposed directions. As a result, the flexible wiring board 400 can be connected to the liquid crystal panel 100. More specifically, the first terminal group 410 can be connected to the first connection terminal area 202, and the second terminal group 420 can be connected to the second connection terminal area 302.

The third terminal group 430 is inserted into the connecting portion (connector) 610 of the control circuit board 600.

The wiring 414 in the first terminal group 410 corresponds in individual line shapes to wiring in the first connection terminal area 202. In other words, the wiring 414 in the first terminal group 410 has substantially the same individual line shapes as the wiring in the first connection terminal area 202.

The wiring 414 in the second terminal group 420 corresponds in individual line shapes to wiring in the second connection terminal area 302. In other words, the wiring 414 in the second terminal group 420 has substantially the same individual line shapes as the wiring in the second connection terminal area 302.

The wiring 414 in the third terminal group 430 corresponds in individual line shapes to terminals in the connecting portion 610 of the control circuit board 600. In other words, the wiring 414 in the third terminal group 430 has substantially the same individual line shapes as the terminals in the connecting portion 610 of the control circuit board 600. The third terminal group 430 comprises terminals electrically continuous to individual terminals of the first terminal group 410 in one-to-one relation, and terminals electrically continuous to individual terminals of the second terminal group 420 in one-to-one relation.

The wiring 414 in each of the first to third terminal groups 410, 420 and 430 is formed, for example, by patterning a copper foil.

Electrical connection between the first terminal group 410 and the first connection terminal area 202 can be made using an anisotropic conductive adhesive 501. Concretely, the electrical connection between them can be established through conductive particles 501a dispersed in the anisotropic conductive adhesive 501 at an appropriate proportion (see FIG. 2). Electrical connection between the second terminal group 420 and the second connection terminal area 302 can be made as with the electrical connection between the first terminal group 410 and the first connection terminal area 202.

When the first base material 412 is made of polyimide, the first base material 412 can be formed, for example, by the following method. A precursor of polyimide is patterned by the photolithography and is then developed into the polyimide. When the second base material 416 is made of polyimide, the second base material 416 can be formed in a similar manner as the first base material 412.

The liquid crystal display device 10 according to the first embodiment can provide such operating advantages as follows.

With the liquid crystal display device 10 according to the first embodiment, the third terminal group 430 on the flexible wiring board 400 is electrically continuous to the first terminal group 410 and the second terminal group 420. Therefore, the control circuit board 600 and the liquid crystal panel 100 can be connected and disconnected just by inserting and removing the third terminal group 430 into and from the connecting portion 610 of the control circuit board 600. As a result, when carrying out inspection, adjustment, various tests, etc. of the liquid crystal panel, the number of steps required for connecting and disconnecting the liquid crystal panel to and from the control circuit board 600 can be reduced.

Also, the flexible wiring board 400 has only one layer of wiring. The construction of the flexible wiring board 400 is therefore simplified. Furthermore, the thickness of the flexible wiring board 400 itself can be reduced, and patterning can be achieved more easily than the case of having two or more layers of wiring.

In the above embodiment, the third terminal group 430 is exposed to the outside by removing the first base material 412. However, the third terminal group 430 may be formed on the lower surface of the first base material 412 by removing the second base material 416 in reversed fashion to the above embodiment.

A connection wiring board according to a second embodiment will be described below. The second embodiment is described in connection with an example in which a flexible wiring board (FPC board) is employed as the connection wiring board. FIG. 5 is a schematic exploded plan view of a flexible wiring board according to the second embodiment.

A flexible wiring board 400 comprises a first flexible wiring board 401 and a second flexible wiring board 402. The first and second flexible wiring boards 401, 402 are each a one-side flexible wiring board which includes wiring provided on one side of a flexible and insulating base material. The first flexible wiring board 401 is constituted by forming wiring 414 on one surface of a first base material 412. The second flexible wiring board 402 is constituted by forming wiring 414 on one surface of a second base material 416. The first and second base materials 412, 416 are each made of, e.g., polyimide. The wiring 414 is made of, e.g., copper.

The first flexible wiring board 401 has the first terminal group 410 and the fourth terminal group 440. Respective terminals of the fourth terminal group 440 are electrically continuous to respective terminals of the first terminal group 410 in one-to-one relation.

The second flexible wiring board 402 has the second terminal group 420, the third terminal group 430, and the fifth terminal group 450. Some terminals of the third terminal group 430 are electrically continuous to respective terminals of the second terminal group 420 in one-to-one relation. Also, the remaining terminals of the third terminal group 430 are electrically continuous to respective terminals of the fifth terminal group 450 in one-to-one relation. The wiring 414 in the fifth terminal group 450 corresponds in individual line shapes to the wiring 414 in the fourth terminal group 440. As described later, the fourth terminal group 440 and the fifth terminal group 450 are electrically and mechanically connected to each other by a solder or an anisotropic conductive adhesive. The remaining terminals of the third terminal group 430 are thereby electrically connected to the respective terminals of the first terminal group 410.

By thus forming the first flexible wiring board 401 and the second flexible wiring board 402 in substantially the same shape except for the first to third terminal group 410, 420 and 430, the following advantages are obtained. One of those flexible wiring boards serves as an overlay for the other flexible wiring board. Concretely, one flexible wiring board is positioned so as to cover one surface of the other. A need of providing an insulating layer for protecting the wiring 414 is therefore eliminated.

The first flexible wiring board 401 and the second flexible wiring board 402 are bonded to each other such that the fourth terminal group 440 and the fifth terminal group 450 contact with each other. Electrical connection is therefore established between the first terminal group 410 and the third terminal group 430.

The first flexible wiring board 401 and the second flexible wiring board 402 can be bonded to each other, by way of example, as follows.

The surface of the first flexible wiring board 401 on which the wiring 414 is formed is positioned to face the surface of the second flexible wiring board 402 on which the wiring 414 is formed. The first flexible wiring board 401 and the second flexible wiring board 402 are aligned with each other at both points a and b. The respective terminals of the fourth terminal group 440 and the respective terminals of the fifth terminal group 450 are electrically connected to each other. The electrical connection between them can be made by soldering or applying an anisotropic conductive adhesive.

As with the first embodiment, an advantage of reducing the number of steps required for carrying out inspection, adjustment and tests can be obtained. In addition, the flexible wiring board 400 comprises the two one-side flexible wiring boards 401, 402. Accordingly, the flexible wiring board 400 can be manufactured by bonding the two one-side flexible wiring boards 401, 402 to each other, and manufacture of the flexible wiring board 400 is facilitated.

An electro-optical device according to a third embodiment will be described below. The electro-optical device according to the third embodiment represents an example in which the present invention is applied to a liquid crystal display of active matrix driving type. FIG. 6 is a schematic plan view of the electro-optical device according to the third embodiment. FIG. 7A is a schematic plan view of a first base material 412 shown in FIG. 6. FIG. 7B is a schematic plan view of a second base material 416 shown in FIG. 6.

A liquid crystal display device 10 according to the third embodiment differs from that according to the first embodiment in construction of a liquid crystal panel 100 and construction of a connection wiring board 400. More specifically, the liquid crystal display device 10 according to the third embodiment differs from that according to the first embodiment in that a terminal group for inputting scanning signals is divided.

The liquid crystal panel 100 will be described below.

The liquid crystal panel 100 according to the third embodiment differs from that according to the first embodiment in the following points. A second substrate 300 has projected portions 310a, 310b projecting from both sides thereof (left and right sides in FIG. 6) outward of the first substrate 200. More specifically, the second substrate 300 has two projected portions 310a, 310b projecting outward of the first substrate 200. A second connection terminal area 302 is formed in one (left-hand) projected portion 310a of the second substrate 300. A third connection terminal area 304 is formed in the other (right-hand) projected portion 310b of the second substrate 300.

A second bare chip 350 is formed in the second connection terminal area 302. A third bare chip 352 is formed in the third connection terminal area 304.

A description is now made of the connection wiring board 400.

The connection wiring board 400 according to the third embodiment differs from that according to the first embodiment in the following point. In the connection wiring board 400 according to the third embodiment, scanning signals are supplied using a second terminal group 420 and a sixth terminal group 460. Concretely, the connection wiring board 400 according to the third embodiment is constructed as follows.

The sixth terminal group 460 is constituted by wiring 414 exposed to the outside due to the absence of a first base material 412. Since the sixth terminal group 460 is not covered by the first base material 412, the surface of the sixth terminal group 460 and the surface of the first terminal group 410 are therefore oriented in opposed directions. As a result, the sixth terminal group 460 can be electrically connected to the third connection terminal area 304.

The wiring 414 in the sixth terminal group 460 corresponds in individual line shapes to the wiring 414 in the third connection terminal area 304. In other words, the wiring 414 in the sixth terminal group 460 has substantially the same individual line shapes as the wiring in the third connection terminal area 304.

Electrical connection between the sixth terminal group 460 and the third connection terminal area 304 can be made in a similar manner as the electrical connection between the first terminal group 410 and the first connection terminal area 202 described above in relation to the first embodiment.

With the liquid crystal display 10 thus constructed, it is possible to, for example, supply scanning signals for even rows to the second bare chip 350 and supply scanning signals for odds rows to the third bare chip 352.

The liquid crystal display device 10 according to the third embodiment can be modified, by way of example, as follows.

The liquid crystal display device 10 according to the third embodiment may be implemented in the form in which the terminal group for inputting data signals is divided. In other words, the sixth terminal group may be provided by dividing the function of the first terminal group 410. Concretely, the liquid crystal display 10 according to the third embodiment may be constructed as follows.

Two connection terminal areas of the first substrate 200 are provided respectively in both upper and lower sides, and data signals are supplied to bare chips each provided in one of the connection terminal areas in the first terminal group and the sixth terminal group. In this case, for example, data signals for even rows are supplied to a bare chip through the sixth terminal group, and data signals for odds rows are supplied to another bare chip through the first terminal group.

An electronic apparatus according to a fourth embodiment will be described below. The electronic apparatus according to the fourth embodiment represents an example in which the electro-optical device according to the present invention is employed. Concretely, the fourth embodiment represents an example in which a liquid crystal device is employed as the electro-optical device according to the present invention.

(1) Projector

A description is first made of a projector using such a liquid crystal device as a light valve. FIG. 8 is a plan view showing an exemplified construction of the projector.

Within a projector 1100, a lamp unit 1102 comprising a white light source, e.g., a halogen lamp, is provided. A projection light emitted from the lamp unit 1102 is separated into the three RGB primary colors by four mirrors 1106 and two dichroic mirrors 1108 which are all arranged in a light guide 1104. Respective pencils of projection light separated into the three primary colors enter liquid crystal panels 1110R, 1110B and 1110G which correspond to the three primary colors and serve as light valves. The liquid crystal panels 1110R, 1110B and 1110G will be referred to together as "liquid crystal panels 1110" hereinafter.

The liquid crystal panels 1110 are each constituted by the liquid crystal panel described above. Each of the liquid crystal panels 1110 has bare chips (not shown) mounted it, and also has a connection wiring board (not shown) connected to it. Then, the liquid crystal panels 1110 are each driven by primary color signals for R, G and B supplied from an image signal processing circuit which is connected to the connection wiring board.

Respective lights modulated by the liquid crystal panels 1110 enter a dichroic prism 1112 from three directions. In the dichroic prism 1112, lights of R and B are deflected at 90 degrees, while a light of G advances straightforward. Accordingly, images of three colors are combined with each other, and a color image is projected on a screen or the like through a projection lens 1114.

Incidentally, respective lights corresponding to the three primary colors enter the liquid crystal panels 1110 with the provision of the dichroic mirrors 1108. A need of providing color filters in the liquid crystal panels 1110 is therefore eliminated.

(2) Digital Still Camera

A description is next made of a digital still camera using the above liquid crystal device in a finder. FIG. 9 is a perspective view showing a construction of the digital still camera. FIG. 9 also shows connections to external equipment in the simplified form.

In an ordinary camera, a film is exposed to a light image of the subject. On the other hand, in a digital still camera 1200, a light image of the subject is photoelectrically converted by image pick-up devices, such as CCDs (Charge Coupled Devices), to produce image pick-up signals. The above-described liquid crystal panel 100 is provided on the rear side of a case 1202 in the digital still camera 1200. The liquid crystal panel 100 displays an image based on the image pick-up signals produced by the CCDs. Thus, the liquid crystal panel 100 functions as a finder to display an image of the subject. A light receiving unit 1204 including an optical lens and the CCDs is provided on the front side of a case 1202 (on the rear side of the drawing sheet of FIG. 9).

When a photographer confirms the subject image displayed on the liquid crystal panel 100 and depresses a shutter button 1206, the image pick-up signals produced by the CCDs at that time are transferred to and stored in a memory on a circuit board 1208. Further, in the digital still camera 1200, a video signal output terminal 1212 and an input/output terminal 1214 for data communications are disposed on a lateral surface of the case 1202. As shown in FIG. 9, a TV monitor 1300 is connected to the former video signal output terminal 1212 and a personal computer 1400 is connected to the latter input/output terminal 1214 for data communications, as required. Then, in response to a predetermined operation, the image pick-up signals stored in the memory on the circuit board 1208 are outputted to the TV monitor 1300 or the personal computer 1400.

(3) Cellular Phone and Other Electronic Apparatuses

FIGS. 10A, 10B and 10C are appearance views showing several examples of other electronic apparatuses in each of which a liquid crystal display is employed as the electro-optical device according to the present invention. FIG. 10A shows a cellular phone 3000 including a liquid crystal display device 1000 disposed in a front upper area. FIG. 10B shows a wrist watch 4000 in which a display unit using the liquid crystal display device 1000 is disposed in a front central area of a watch body. FIG. 10C shows a personal digital assistant 5000 including a display unit, which comprises the liquid crystal display device 1000, and an input unit 5100.

In addition to the liquid crystal display 1000, though not shown, each of those electronic apparatuses includes, e.g., various circuits such as a displayed information output source, a displayed information processing circuit and a clock generating circuit, and a display signal generating unit comprising a power supply circuit for supplying power to the above circuits, etc. In the case of the personal digital assistant 5000, for example, a display signal generated by the display signal generating unit in accordance with information inputted from the input unit 5100, for example, is supplied to the display unit, whereupon a display image is formed in the display unit.

Electronic apparatuses in each of which the liquid crystal display according to the present invention is incorporated are not limited to digital still cameras, cellular phones, wrist watches and personal digital assistants, but may also include electronic pocketbooks, pagers, POS terminals, IC cards, mini-disk players, liquid crystal projectors, multimedia-adapted personal computers (PCs) and engineering work stations (EWSs), notebook personal computers, word processors, TVs, viewfinder-type or monitor direct-view-type video tape recorders, electronic desktop calculators, car navigation systems, apparatus having touch panels, watches, etc.

The present invention is not limited to the above embodiments, but can be modified in various ways without departing the scope of the present invention. The present invention can be modified, by way of example, as follows.

(1) The above embodiments have been described in connection with an example in which the electro-optical device according to the present invention is applied to a liquid crystal display of active matrix driving type. However, liquid crystal displays, to which the electro-optical device according to the present invention is applicable, is not limited to the active matrix driving type, but may be of passive matrix driving type.

A liquid crystal display of passive matrix driving type will be described below. FIG. 11 is a plan view showing an entire construction of the liquid crystal display of passive matrix driving type. In the liquid crystal display shown in FIG. 11, the connection wiring board described in connection with the first embodiment is connected to a liquid crystal panel of passive matrix driving type.

A liquid crystal display device 10 of passive matrix driving type differs from the liquid crystal display device of active matrix driving type in that switching devices are not provided. The other construction of the liquid crystal display 10 of passive matrix driving type is essentially the same as the liquid crystal display of active matrix driving type. The liquid crystal display 10 of passive matrix driving type is now described more concretely. A description is omitted for numerals denoting essentially the same components as in the first embodiment.

A plurality of data lines 212 are arranged in parallel on one surface of a first substrate 200 (referred to as an "opposite surface of a first substrate") which faces a second substrate 300. The data lines 212 are formed of a conductive material transparent to a display light, e.g., ITO (Indium Tin Oxide). The data lines 212 are arranged to extend in a predetermined direction (X-direction in FIG. 11) with a predetermined spacing therebetween. On the other hand, a plurality of scanning lines 312 are arranged on one surface of the second substrate 300 (referred to as an "opposite surface of the second substrate") which faces the first substrate 200. The scanning lines 312 are formed of a conductive material reflecting the display light, or of a conductive material transparent to the display light, e.g., ITO. The scanning lines 312 are arranged in parallel to extend in a predetermined direction (Y-direction in FIG. 11) with a predetermined spacing therebetween. Thus, the plurality of data lines 212 formed on the first substrate 200 and the plurality of scanning lines 312 formed on the second substrate 300 are positioned perpendicularly to each other with a liquid crystal layer, etc. (including a not-shown orientation film) held between both the boards, thereby constituting the so-called X-Y matrix.

Further, a flexible wiring board connected to the liquid crystal panel of passive matrix driving type are not limited to the flexible wiring board described in connection with the first embodiment, but may be the connection wiring board described in connection with the second or third embodiment.

(2) In the above embodiments, bare chips are provided one on each of the boards of the electro-optical panel. In other words, total two bare chips are provided on the electro-optical panel. However, the present invention is not limited to such an arrangement, and three or more bare chips may be provided depending on the driving ability, the number of scanning lines, and the number of data lines.

What is claimed is:

1. A wiring board for connection of an electro-optical panel, said connection wiring board being connected to an electro-optical panel having a pair of opposed substrates, said connection wiring board comprising:

a first base material and a second base material;

a first terminal group provided on said first base material;

a second terminal group provided on said second base material; and a third terminal group provided on said first base material or said second base material;

said third terminal group including at least terminals electrically continuous to said first terminal group and terminals electrically continuous to said second terminal group.

2. A wiring board for connection of an electro-optical panel according to claim 1, wherein said connection wiring board has a multilayered structure including said first base material and said second base material in at least a part of said connection wiring board.

3. A wiring board for connection of an electro-optical panel according to claim 1, wherein a connection surface of said first terminal group and a connection surface of said second terminal group are oriented in opposed directions.

4. A wiring board for connection of an electro-optical panel according to claim 1, wherein said first terminal group is exposed to the outside due to an absence of said second base material.

5. A wiring board for connection of an electro-optical panel according to claim 1, wherein said second terminal group is exposed to the outside due to an absence of said first base material.

6. A wiring board for connection of an electro-optical panel according to claim 1, wherein said first and second base materials are each formed of a flexible insulating film.

7. A wiring board for connection of an electro-optical panel according to claim 1, wherein a wiring of said wiring board is formed of a material mainly containing any of copper, copper alloys, aluminum, aluminum alloys, gold, and silver.

8. A wiring board for connection of an electro-optical panel according to claim 1, wherein a wiring in said first terminal group and a wiring in said second terminal group are positioned in a common layer.

9. A wiring board for connection of an electro-optical panel according to claim 1, wherein said first base material further includes a fourth terminal group electrically continuous to said first terminal group; and said second base material further includes a fifth terminal group electrically continuous to said third terminal group, said fifth terminal group being electrically continuous to said fourth terminal group.

10. A wiring board for connection of an electro-optical panel according to claim 9, further comprising a sixth terminal group electrically continuous to said third terminal group.

11. A wiring board for connection of an electro-optical panel according to claim 1, wherein a shape of said first base material and a shape of said second base material are substantially the same except for said terminal groups.

12. An electro-optical device including an electro-optical panel having a first substrate and a second substrate opposed to each other, wherein:

said first substrate has a first connection terminal area not overlapping said second substrate;

said second substrate has a second connection terminal area not overlapping said first substrate;

said first connection terminal area and said second connection terminal area are electrically connected to a wiring board for connection of the electro-optical panel according to claim 1;

the first terminal group on said connection wiring board is electrically connected to said first connection terminal area; and the second terminal group on said connection wiring board is electrically connected to said second connection terminal area.

13. An electro-optical device according to claim 12, wherein said electro-optical device further comprises a control circuit board; and said control circuit board is electrically connected to a third terminal group on said connection wiring board.

14. An electro-optical device according to claim 12, wherein at least one of connection between said first terminal group and said first connection terminal area and connection between said second terminal group and said second connection terminal area is established using an anisotropic conductive adhesive.

15. An electro-optical device according to claim 12, wherein said electro-optical device is a liquid crystal device.

16. An electro-optical device according to claim 12, wherein a semiconductor device for driving said electro-optical device is mounted in at least one of said first connection terminal area and said second connection terminal area.

17. An electronic apparatus including the electro-optical device according to claim 12.

* * * * *

UNITED STATES PATENT AND TRADEMARK OFFICE
CERTIFICATE OF CORRECTION

PATENT NO. : 6,519,021 B1  
DATED : February 11, 2003  
INVENTOR(S) : Yasuhito Aruga It is certified that error appears in the above-identified patent and that said Letters Patent is hereby corrected as shown below:

Column 3,  
Line 19, "4" should be -- 1 --

Column 10,  
Line 33, delete "5"

Column 11,  
Line 54, "odds" should be -- odd --

Column 12,  
Line 14, after "mounted" insert -- to --

Signed and Sealed this

Seventh Day of October, 2003

JAMES E. ROGAN  
*Director of the United States Patent and Trademark Office*